US012482641B2

(12) United States Patent
Peterson et al.

(10) Patent No.: US 12,482,641 B2
(45) Date of Patent: Nov. 25, 2025

(54) PRINTED MICROWAVE RESONATOR FOR MEASURING HIGH ELECTRON DENSITY PLASMAS

(71) Applicant: Applied Materials, Inc., Santa Clara, CA (US)

(72) Inventors: David Peterson, San Jose, CA (US); David Coumou, Webster, NY (US); Chuang-Chia Lin, San Ramon, CA (US); Kelvin Chan, San Ramon, CA (US); Farzad Houshmand, Mountain View, CA (US); Ping-Hwa Hsieh, Milpitas, CA (US); Kristopher Ford, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 242 days.

(21) Appl. No.: 18/208,174

(22) Filed: Jun. 9, 2023

(65) Prior Publication Data

US 2024/0412959 A1 Dec. 12, 2024

(51) Int. Cl.
*H01J 37/32* (2006.01)

(52) U.S. Cl.
CPC .. *H01J 37/32917* (2013.01); *H01J 37/32935* (2013.01); *H01J 2237/24507* (2013.01)

(58) Field of Classification Search
CPC ....... H01J 2237/24507; H01J 37/32917; H01J 37/32935
See application file for complete search history.

(56) References Cited

U.S. PATENT DOCUMENTS

| | | | |
|---|---|---|---|
| 10,658,424 B2 | 5/2020 | Oliver et al. | |
| 2011/0175531 A1 | 7/2011 | Urdahl et al. | |
| 2011/0234240 A1* | 9/2011 | Yager | A61B 5/4875 324/634 |
| 2015/0015140 A1 | 1/2015 | Denning et al. | |
| 2022/0123449 A1* | 4/2022 | Lauer | H01P 3/084 |
| 2023/0044262 A1* | 2/2023 | Peterson | H01J 37/32917 |
| 2023/0398511 A1* | 12/2023 | Nutter, Jr. | B01J 19/088 |
| 2024/0035896 A1* | 2/2024 | Lin | H01L 21/67248 |

FOREIGN PATENT DOCUMENTS

| | | |
|---|---|---|
| CN | 119519638 A * | 2/2025 |
| EP | 4047633 A1 | 8/2022 |

OTHER PUBLICATIONS

English translation of CN 119519638 A (Year: 2025).*
International Search Report and Written Opinion from PCT/US2024/025647 dated Aug. 13, 2024, 11 pgs.
Subhadip, et al., "Development of planar microstrip resonators for electron spin resonance spectroscopy," arXiv:2004.00457v1, Apr. 1, 2020, pp. 1-6.

* cited by examiner

*Primary Examiner* — Mark R Gaworecki
(74) *Attorney, Agent, or Firm* — Schwabe, Williamson & Wyatt, P.C.

(57) ABSTRACT

Embodiments disclosed herein include a module, comprising: a substrate, wherein the substrate comprises a dielectric material, and a microstrip resonator on the substrate. In an embodiment, a microstrip transmission line is on the substrate adjacent to the microstrip resonator, and the microstrip resonator is spaced from the microstrip transmission line by a gap. In an embodiment, a ground plane on a surface of the substrate is opposite from the microstrip resonator.

22 Claims, 9 Drawing Sheets

PRINTED MICROWAVE RESONATOR FOR MEASURING HIGH ELECTRON DENSITY PLASMAS

BACKGROUND

1) Field

Embodiments relate to the field of semiconductor manufacturing and, in particular, microwave resonators for measuring high electron density plasmas.

2) Description of Related Art

Semiconductor processing environments often use plasma sources. In order to provide highly repeatable and stable processing environments, it is desirable to measure various plasma properties, such as electron density, electron temperature, and the like. In some instances high density plasmas are used. High density plasmas are particularly difficult to measure with existing metrology tools.

One limitation of existing tools is that resonator manufacturing technology does not include the repeatable and precise tolerances necessary for high performance tools. Such limitations are particularly detrimental to the measurement of high density plasmas. For example, the operational frequency of the resonators may be limited. This is detrimental because higher operating frequencies are needed to measure higher density plasmas due to the electron density dependent lossy dielectric nature of plasmas.

SUMMARY

Embodiments disclosed herein include a module, comprising: a substrate, wherein the substrate comprises a dielectric material, and a microstrip resonator on the substrate. In an embodiment, a microstrip transmission line is on the substrate adjacent to the microstrip resonator, and the microstrip resonator is spaced from the microstrip transmission line by a gap. In an embodiment, a ground plane on a surface of the substrate is opposite from the microstrip resonator.

Embodiments disclosed herein further comprise a module for measuring plasma properties. In an embodiment, the module comprises a substrate, and a resonator on the substrate. In an embodiment, a transmission line is on the substrate and coupled to the resonator. In an embodiment, the transmission line is spaced away from the resonator by a gap.

Embodiments disclosed herein further comprise a semiconductor processing tool. In an embodiment, the tool comprises a chamber configured to generate a plasma, and a sensor within the chamber. In an embodiment, the sensor comprises a dielectric substrate, a microstrip resonator, a microstrip transmission line, and a ground plane on a surface of the dielectric substrate opposite from the microstrip resonator.

DETAILED DESCRIPTION

Figure 1:
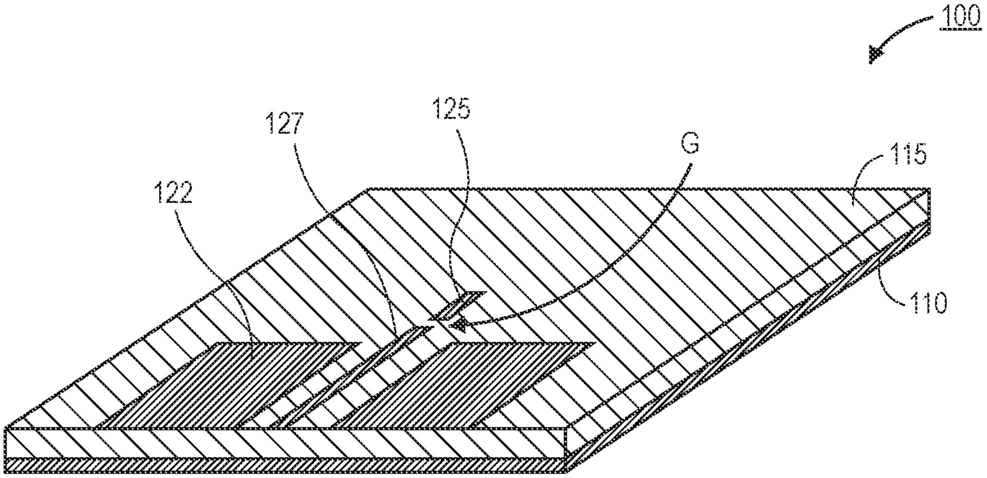
FIG. 1 is a perspective view illustration of a sensor for measuring plasma properties in a high density plasma, in accordance with an embodiment.

Systems described herein include modules including microwave resonators for measuring high electron density plasmas. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, plasma diagnostics can be determined using resonator structures. For example, the resonating element is placed in a plasma. The shift in resonance frequency is then used to measure plasma properties, such as electron density, electron temperature, or the like. More particularly, embodiments disclosed herein allow for monitoring higher plasma density plasmas due to improvements in the resonator structure. For example, the resonator may be fabricated with improved manufacturing control and tolerances. In an embodiment, the resonator structure is formed on a printed circuit board (PCB). The use of PCB technologies allow for tolerances that are down to approximately 1 μm or less.

In certain embodiments, the resonators are provided adjacent to a transmission line. The gap between the transmission line and the resonator may be chosen in order to provide a desired operational frequency of the sensor. For example, gaps between approximately 100 μm and approximately 1,000 μm may be used in some embodiments.

It is to be appreciated that thermal heating may also play a role in shifting the frequency of the resonator. As such, the temperature charges need to be accounted for in order to provide accurate measures of the plasma properties. Accordingly, embodiments disclosed herein include pairs of resonators. A first resonator is provided at a top surface of the sensor substrate, and a second resonator is buried in (or embedded in) the sensor substrate. This allows for the first resonator to be exposed to the plasma environment, while the second resonator experiences the same temperature increases without interfacing with the plasma environment. The second resonator can, therefore, be used as a reference signal in order to account for the changes in temperature.

Further, embodiments disclosed herein include sensors with a plurality of resonators that are tuned to different operational frequencies. As such, the plasma properties can be monitored through different stages of the plasma process, including warm up, processing, or any other stage. In an embodiment, the different frequencies can be tuned by using different sized resonators and providing different gaps between the resonator and the adjacent transmission line.

Embodiments disclosed herein also allow for the sensor to be provided in a plasma processing tool at various locations. In one embodiment, the sensor is wall mounted within a plasma chamber. In another embodiment, the sensor is provided on a probe that is inserted into the center of the plasma processing tool above a substrate. In yet another embodiment, the sensor is provided on a wafer form factor substrate that can be inserted into the plasma processing tool.

Referring now to FIG. 1, a perspective view illustration of a sensor 100 is shown, in accordance with an embodiment. In an embodiment, the sensor 100 may include a substrate 115. The substrate 115 may be a dielectric substrate. In a particular instance, the substrate 115 is an substrate, such as a printed circuit board (PCB) substrate. In an embodiment, the substrate 115 may have a thickness that is between approximately 100 μm and approximately 5,000 μm. Though, thicker or thinner substrates 115 may also be used in some embodiments.

The surface area of the substrate 115 may be suitable for different integration options. For example, the substrate 115 may have a form factor that is similar to a wafer (e.g., 150 mm, 200 mm, 300 mm, 450 mm, etc.). In such an embodiment, the sensor 100 may be inserted into a chamber for monitoring the plasma. In other embodiments, the substrate 115 may be sized for a wall mounted or probe configuration. That is, the substrate 115 may have a surface area with a form factor that is smaller than a wafer. Wafer sized sensors, wall mounted sensors, and probe sensors are described in greater detail below.

In an embodiment, a ground plane 110 may be provided over a bottom of the substrate 115. The ground plane 110 may be an electrically conductive layer that covers substantially all of a bottom surface of the substrate 115. For example, the ground plane 110 may comprise copper or the like. While shown as being exposed, some embodiments may include a buried ground plane 110.

In an embodiment, the sensor 100 may include a resonator 125. The resonator 125 may be provided over a top surface of the substrate 115 opposite from the ground plane 110. In an embodiment, the resonator 125 may be a linear trace. More particularly, the resonator 125 may be a microstrip resonator. Though, other resonator architectures may also be used in some embodiments. In an embodiment, the resonator 125 may be spaced away from the transmission line 127 by a gap G. The transmission line 127 may be microstrip structure as well. The transmission line 127 may extend towards an edge of the substrate 115. In an embodiment, the gap G may be provided between an end of the resonator 125 and an end of the transmission line 127. Though, as will be described in greater detail below, a side of the resonator 125 may overlap a side of the transmission line 127.

In an embodiment, the length of the resonator 125 and the gap G can be controlled in order to provide a desired operational frequency for the sensor 100. Due to precise manufacturing capabilities of PCB processes, the gap G can be controlled to within approximately 10 μm or less, approximately 5 μm or less, or approximately 1 μm or less. In an embodiment, the gap G may be between approximately 100 μm and approximately 1,000 μm. The operational frequency of the resonator 125 may be selected from a range between approximately 1 GHz and approximately 40 GHz.

In an embodiment, ground pads 122 may be provided on either side of the transmission line 127. The ground pads 122 may be electrically coupled to the ground plane 110. For example, vias (not visible in FIG. 1) may pass through the substrate 115 in order to couple the ground pads 122 to the ground plane 110. The ground pads 122 may be used to electrically couple the ground plane 110 to an external ground plane (not shown). A similar design may be used to turn the microstrip into a GCPW design, which may enable higher frequencies.

Figure 2:
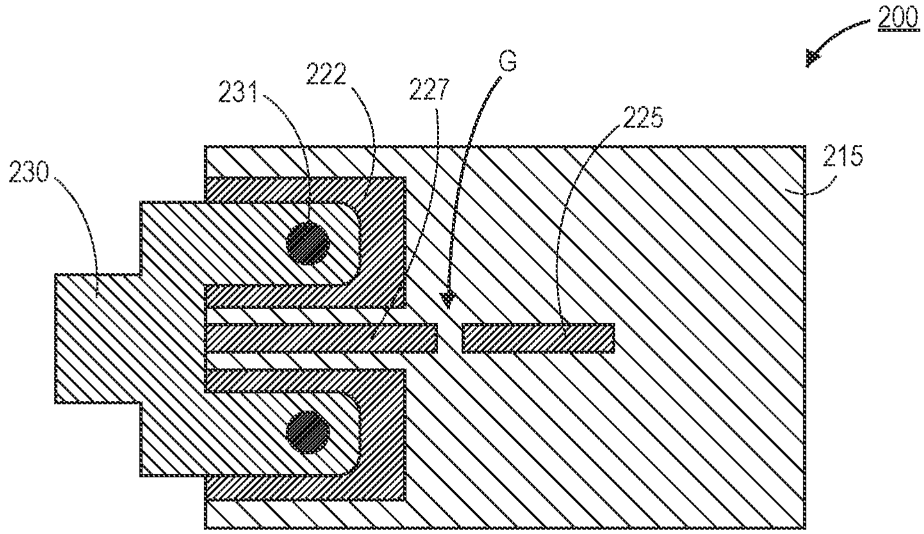
FIG. 2 is a plan view illustration of a sensor for measuring plasma properties in a high density plasma with a coupler, in accordance with an embodiment.

Referring now to FIG. 2, a plan view illustration of a sensor 200 is shown, in accordance with an embodiment. The sensor 200 may comprise a substrate 215, such as a PCB or the like. In an embodiment, a resonator 225 and a transmission line 227 may be provided on the top surface of the substrate 215. The resonator 225 and the transmission line 227 may be microstrip architectures in some embodiments. An end of the resonator 225 may be spaced away from an end of the transmission line 227 by a gap G. The gap G may be between approximately 100 μm and approximately 1,000 μm in order to set a desired resonance for the resonator 225. As shown, ground pads 222 may be provided adjacent to both sides of the transmission line 227 in order to electrically couple the ground plane 110 to an external ground plane (not shown).

In an embodiment, a coupler 230 is attached to the substrate 215. The coupler 230 may provide electrical coupling between the transmission line 227 and a cable (not shown). The coupler 230 may be any standard coupling architecture. For example, the coupler 230 may be a subminiature version A (SMA) to PCB coupler or the like. The coupler 230 may be attached to the board by fasteners 231, such as screws, bolts, or the like. In an embodiment, the fasteners 231 may couple to the ground pads 222. As such, the housing of the coupler 230 may also be grounded in some embodiments.

Figure 3A:
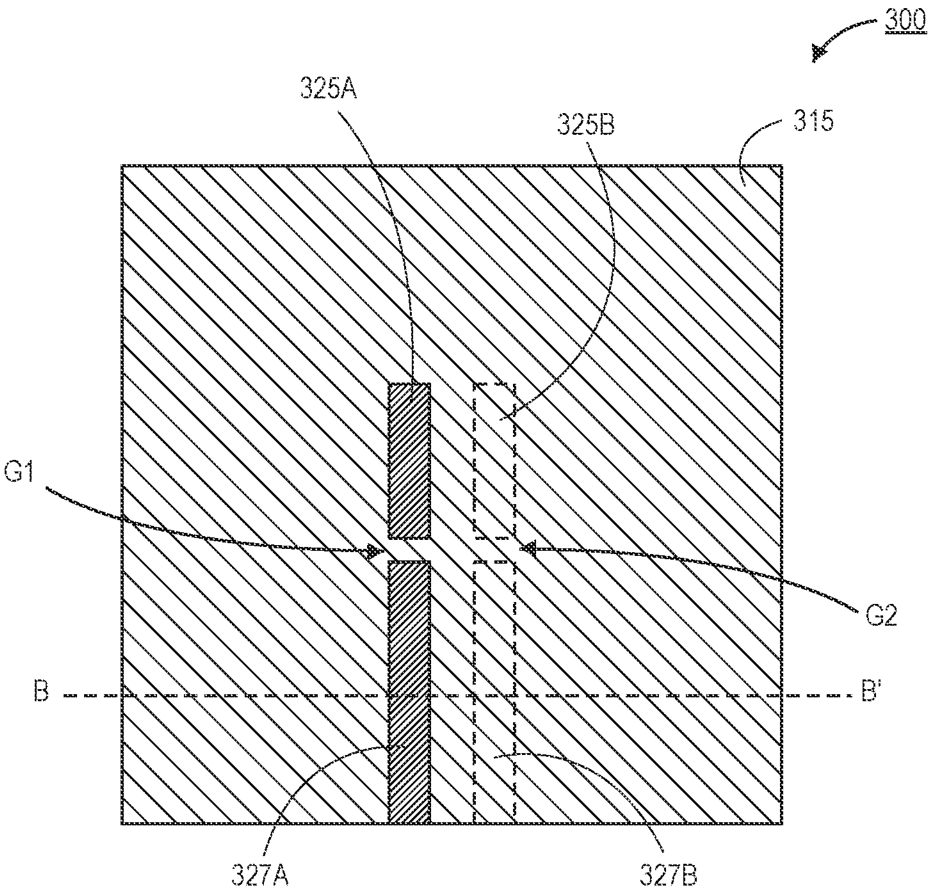
FIG. 3A is a plan view illustration of a sensor with a first resonator and a second, buried, resonator that allows for temperature compensation, in accordance with an embodiment.

Referring now to FIG. 3A, a plan view illustration of a sensor 300 is shown, in accordance with an additional embodiment. In an embodiment, the sensor 300 includes a substrate 315, such as a PCB or the like. In an embodiment, a first resonator 325A and a second resonator 325B are provided on the substrate 315. The first resonator 325A may be spaced away from a first transmission line 327A by a first gap G1, and the second resonator 325B may be spaced away from a second transmission line 327B by a second gap G2. In an embodiment, the first resonator 325A and the first transmission line 327A are on a top surface of the substrate 315, and (as indicated by dashed lines) the second resonator 325B and the second transmission line 327B are embedded within the substrate 315.

In an embodiment, the second resonator 325B and the second transmission line 327B serve as a reference for the first resonator 325A and the first transmission line 327B. More particularly, the reference is used to accommodate temperature changes in the system. Without a reference, a temperature change would provide an undetectable shift in the resonance of the first resonator 325A. With the reference, both the first resonator 325A and the second resonator 325B will experience relatively the same temperature increase. However, only the first resonator 325A will be exposed to the plasma environment. As such, effects related to temperature change can be canceled out.

In order to provide a proper reference, the dimensions of the first resonator 325A and the second resonator 325B may be substantially equal to each other. Further, the first gap G1 may be substantially equal to the second gap G2.

Figure 3B:
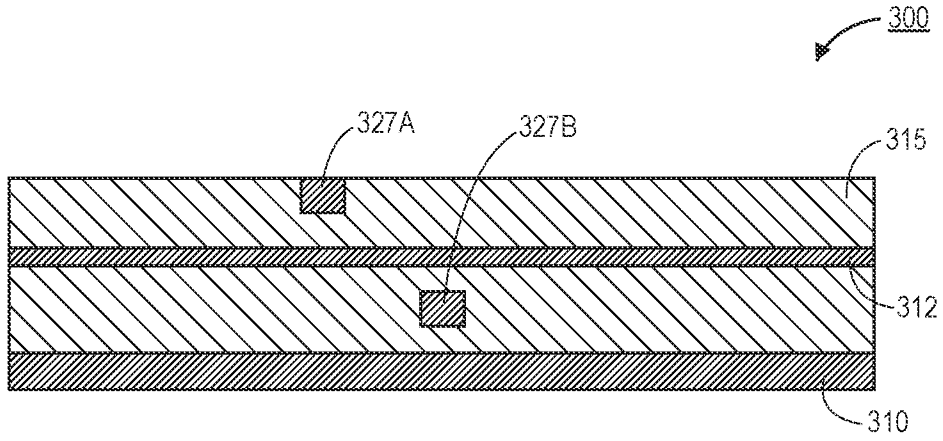
FIG. 3B is a cross-sectional illustration of the sensor in FIG. 3A, in accordance with an embodiment.

Referring now to FIG. 3B, a cross-sectional illustration of the sensor 300 in FIG. 3A along line B-B' is shown, in accordance with an embodiment. In an embodiment, the first transmission line 327A is provided at a top of the substrate 315, and the second transmission line 327B is embedded within the substrate 315. Further, a shield plane 312 may be provided between a top surface of the substrate 315 and the second transmission line 327B. The shield plane 312 (e.g., a copper ground plane) may provide electrical shielding in order to electrically isolate the second transmission line 327B (and the second resonator 325B) from the plasma environment.

In an embodiment, the first resonator 325A and the first transmission line 327A have a microstrip architecture. That is, a conductive trace is provided over a single ground reference plane (e.g., the shield plane 312 or the ground plane 310). The second resonator 325B and the second transmission line 327B may have a stripline architecture. That is, a conductive trace is provided between a pair of ground planes (e.g., shield plane 312 and ground plane 310).

While a buried reference resonator is provided as one example to account for temperature changes, embodiments are not limited to such configurations. For example, an integrated temperature sensor or the like may be included in the sensor 300 in order to calculate the resonance shift attributable to the temperature change.

Figure 4A:
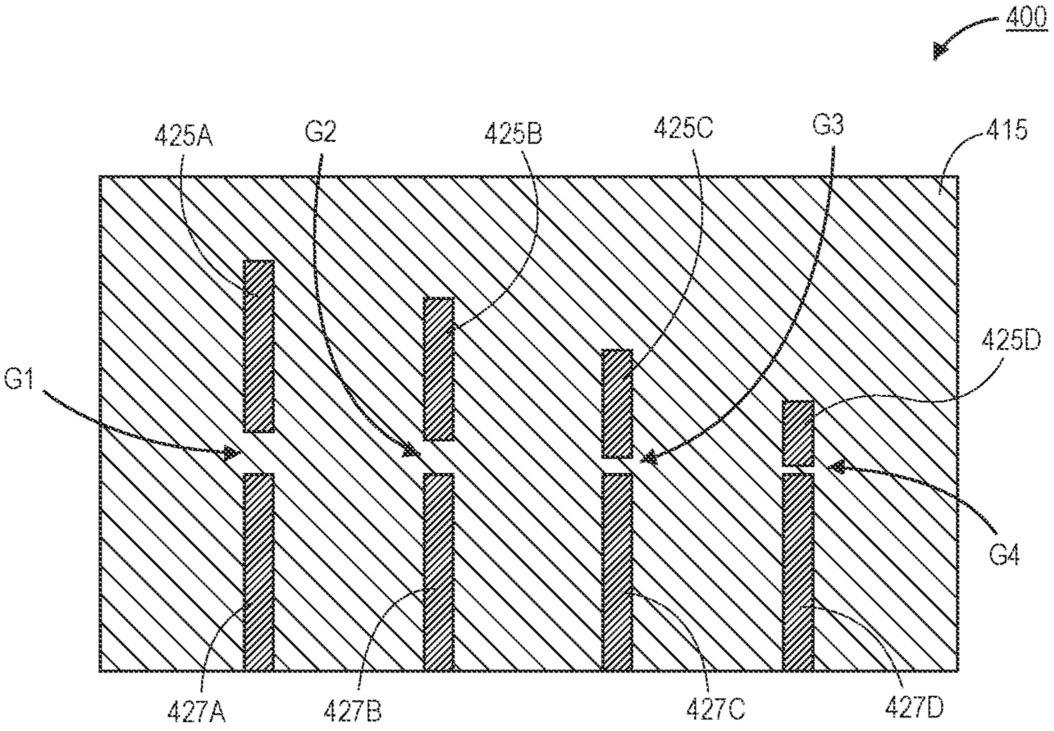
FIG. 4A is a plan view illustration of a sensor with a plurality of resonators with different operational frequencies, in accordance with an embodiment.

Referring now to FIG. 4A, a cross-sectional illustration of a sensor 400 is shown, in accordance with an embodiment. In an embodiment, the sensor 400 includes a substrate 415, such as a PCB or the like. In an embodiment, a plurality of resonator 425 and transmission line pairs 427 are provided across the substrate 415. For example, a set of four pairs of resonators 425A-425D and transmission lines 427A-427D are provided in FIG. 4A. Though, fewer or more pairs may be included in other embodiments.

In an embodiment, the pairs may be used in order to provide a range of operational frequencies for the sensor 400. This can be beneficial for monitoring a plasma at various stages of a process. For example, plasmas during warm up, device processing, or the like can be measured, even when the plasma is operating at different frequencies, powers, etc.

In an embodiment, the different frequencies can be obtained through the use of different resonator 425 dimensions and gap sizes. For example, the resonators 425 may have decreasing lengths as the operational frequency increases. Similarly, the gaps G (e.g., gaps G1-G4) can decrease in size as the operational frequency increases. In some embodiments, the gaps G may be between approximately 100 μm and approximately 1,000 μm. The operational frequency offsets between resonators 425 may be any desired level. In a particular embodiment, the frequency offsets may be approximately 250 MHz or less. Though, larger frequency offsets may also be used in some embodiments.

Figure 4B:
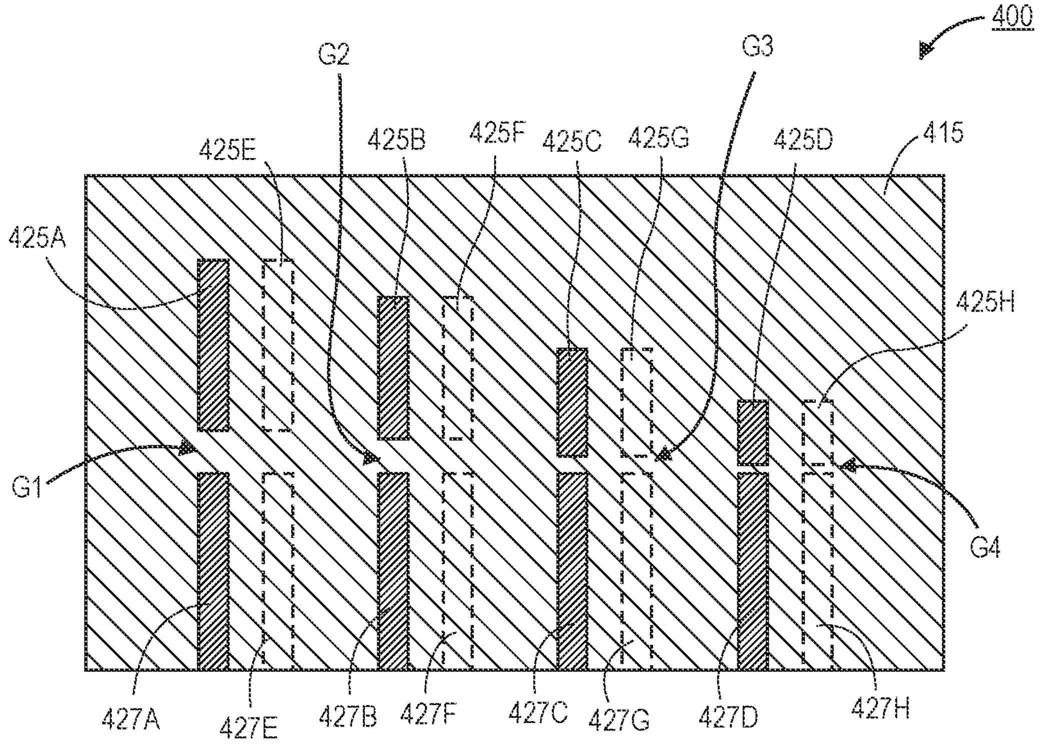
FIG. 4B is a plan view illustration of a sensor with first resonators and second resonators that are buried in the substrate for temperature compensation, in accordance with an embodiment.

Referring now to FIG. 4B, a plan view illustration of a sensor 400 is shown, in accordance with an additional embodiment. In an embodiment, the sensor 400 in FIG. 4B may be similar to the sensor 400 in FIG. 4A, with the exception of there being a plurality of reference resonators. As indicated by the dashed lines, reference resonators 425E-425H (and reference transmission lines 427E-427H) may be buried, or embedded, within the substrate 415. In an embodiment, each reference resonator 425E-425H is paired with a resonator 425A-425D on the surface of the substrate 415. For example, resonator 425A is paired with resonator 425E, resonator 425B is paired with resonator 425F, resonator 425C is paired with resonator 425G, and resonator 425D is paired with resonator 425H. The buried resonators 425E-425H may be separated from the top surface by a shield plane, such as a copper ground plane.

In an embodiment, each pair (i.e., top surface resonator 425 and embedded resonator 425) includes similar dimensions. Also, the gap between resonators 425 and the transmission lines 427 are the same for each pair. Accordingly, the buried resonator 425 can function as a temperature reference for the paired top surface resonator 425.

Figure 5A:
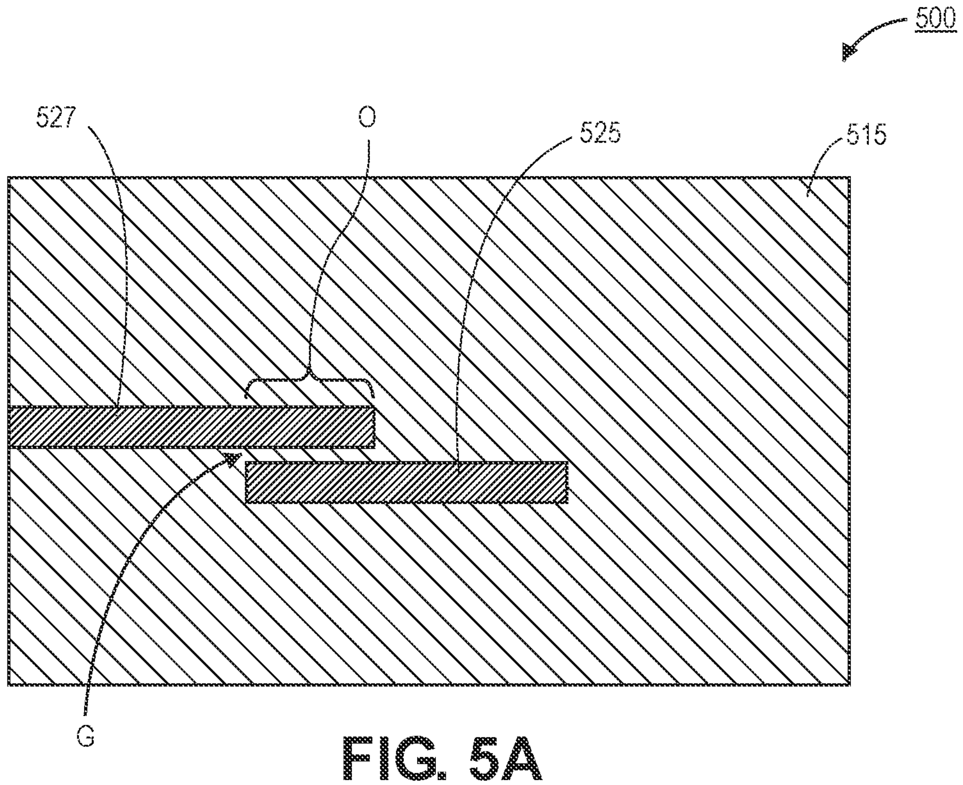
FIG. 5A is a plan view illustration of a sensor with a resonator that is laterally overlapping a portion of the transmission line, in accordance with an embodiment.

Referring now to FIG. 5A, a plan view illustration of a sensor 500 is shown, in accordance with an additional embodiment. The sensor 500 may include a substrate 515, such as a PCB or the like. In an embodiment, the sensor 500 may comprise a resonator 525 and a transmission line 527 that extends to an edge of the substrate 515. In an embodiment, the resonator 525 may overlap a portion of the transmission line 527. For example, a side surface of the resonator 525 faces a portion of the side surface of the transmission line 527. Further, a centerline of the resonator 525 may be offset from a centerline of the transmission line 527. There may also be a gap G between the side surface of the resonator 525 and the side surface of the transmission line 527. The gap G may be between approximately 100 μm and approximately 1,000 μm.

The overlapping portion may have an overlap dimension O. The overlap O may be between approximately 100 μm and approximately 1,000 μm. Changing the dimensions of the overlap O can be used to modulate the capacitive coupling of the resonator 525 to the transmission line 527.

Figure 5B:
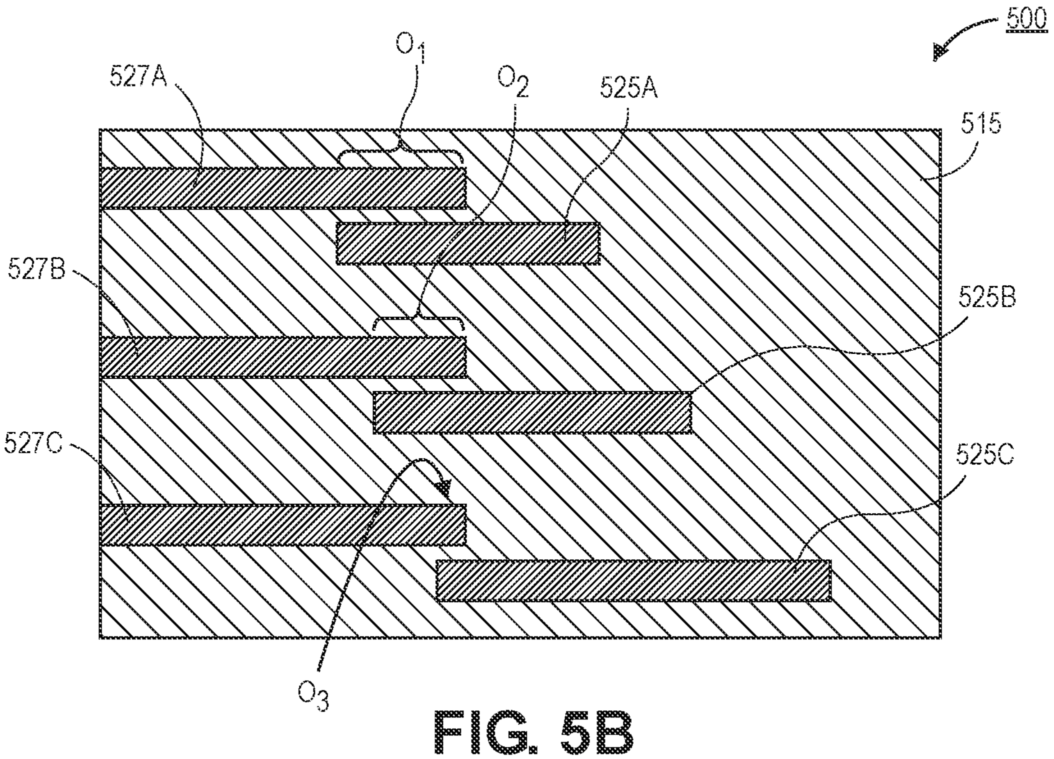
FIG. 5B is a plan view illustration of a sensor with a plurality of resonators with different overlaps, in accordance with an embodiment.

Referring now to FIG. 5B, a plan view illustration of a sensor 500 is shown, in accordance with an additional embodiment. In an embodiment, the sensor 500 may include a substrate 515. A plurality of resonators 525A-525C may be provided over the substrate 515. Each of the resonators 525A-525C may be paired with one of a plurality of transmission lines 527A-527C. In an embodiment, each of the resonators 525 may have an overlap with one of the transmission lines 527. For example, resonator 525A overlaps the transmission line 527A by an overlap O1, resonator 525B overlaps the transmission line 527B by an overlap O2, and resonator 525C overlaps the transmission line 525C by an overlap O3.

In an embodiment, the overlaps O1, O2, and O3 may be different from each other. Additionally, the lengths of the resonators 525A-525C may be different from each other. The differences in the overlaps and the resonator 525 length tunes the capacitive coupling between resonators 525A-525C and transmission lines 527A-527C which thereby allows for various operational frequencies to be set for the sensor 500. In an embodiment, frequency offsets may be approximately 250 MHz or smaller. Though, larger frequency offsets may also be provided in some embodiments.

Figure 6A:
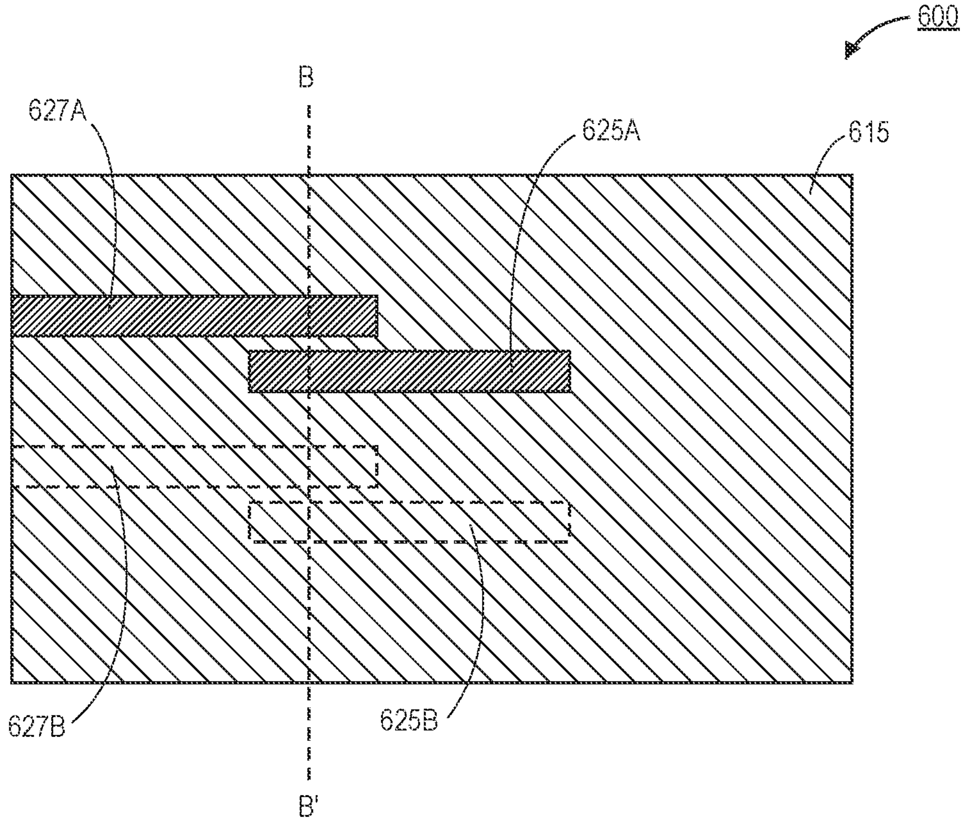
FIG. 6A is a plan view illustration of a sensor with a first resonator and a second resonator that is buried in the substrate, in accordance with an embodiment.

Referring now to FIG. 6A, a plan view illustration of a sensor 600 is shown, in accordance with an additional embodiment. The sensor 600 may include a substrate 615, such as a PCB or the like. In an embodiment a pair of resonators 625A and 625B are provided on the substrate 615. The first resonator 625A may overlap a first transmission line 627A, and the second resonator 625B may overlap a second transmission line 627B. The first resonator 625A may be provided on a top surface of the substrate 615, and the second resonator 625B may be embedded in the substrate 615.

The first resonator 625A and the second resonator 625B may be similar to each other, with the exception of being on the surface of the substrate 615 (i.e., resonator 625A) or embedded in the substrate 615 (i.e., resonator 625B). For example, overlap dimensions with the transmission lines 627, and lengths of the resonators 625 may be substantially equal to each other. In an embodiment, the second resonator 625B may be a reference resonator in order to provide temperature change calibration. While the first resonator 625A and the second resonator 625B may be similar to each other, as described above, in other embodiments, the first resonator 625A may be different than the second resonator 625B. For example, there may be different overlap lengths, gaps, trace lengths, or the like.

Figure 6B:
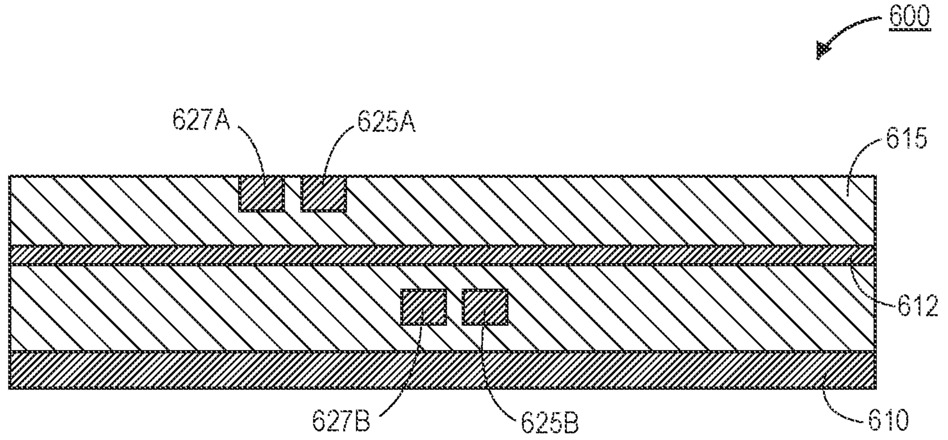
FIG. 6B is a cross-sectional illustration of the sensor of FIG. 6A, in accordance with an embodiment.

Referring now to FIG. 6B, a cross-sectional illustration of the sensor 600 in FIG. 6A along line B-B' is shown, in accordance with an embodiment. As shown, the first transmission line 627A and the first resonator 625A are at a top surface of the substrate 615, and the second transmission line 627B and the second resonator 625B are embedded within the substrate 615. Further, a ground plane 610 may be provided at a bottom of the substrate 615.

In an embodiment, a shield plane 612 may also be embedded in the substrate 615. The shield plane 612 may be used to electrically shield the second resonator 625 from the electrical fields in the plasma environment. As such, shifting of the resonance frequency of the second resonator 625 may be attributable to only temperature change. Accordingly, resonance shift in the first resonator 625A due to temperature can be canceled out in order to provide an accurate measure of plasma properties in the chamber.

Referring now to FIGS. 7A-7D, a series of sensors 760 are shown, in accordance with various embodiments. The sensors 760 in FIGS. 7A-7D may have wafer form factors. That is, the sensors 760 may have form factors that are compatible with wafer handling robots and devices within a processing tool. As such, the sensors 760 can be inserted into processing chambers and used to monitor the plasma environment.

Figure 7A:
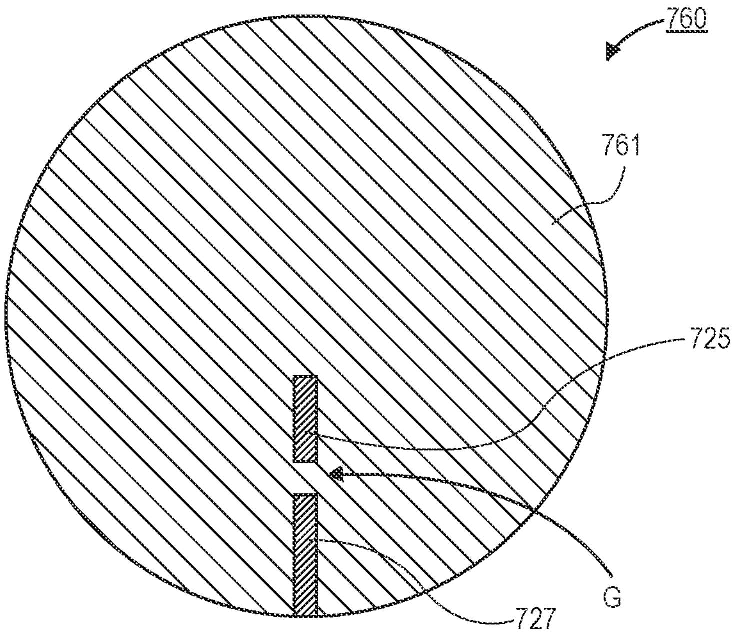
FIG. 7A is a plan view illustration of a wafer level sensor that includes a resonator and a transmission line, in accordance with an embodiment.

Referring now to FIG. 7A, a sensor 760 is shown, in accordance with an embodiment. In an embodiment, the sensor 760 comprises a substrate 761 with a wafer form factor. In an embodiment, the substrate 761 is a PCB or the like. The sensor 760 may include a resonator 725. The resonator 725 may be a microstrip. That is, a ground plane (not shown) may be provided below the resonator 725. The resonator 725 may be spaced away from a transmission line 727 (which may also be a microstrip) by a gap G. The gap G may be between approximately 100 μm and approximately 1,000 μm. The gap G and the length of the resonator 725 may be modified in order to provide a desired operational frequency for the resonator 725. For example, the resonator 725 may have a resonant frequency between approximately 1 GHz and approximately 40 GHz.

Figure 7B:
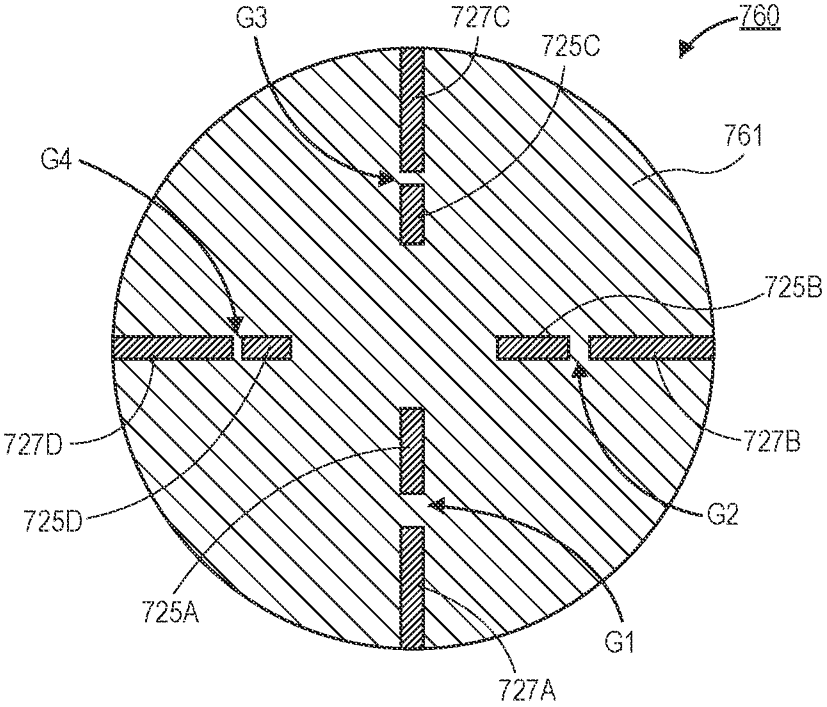
FIG. 7B is a plan view illustration of a wafer level sensor that includes a plurality of resonators that operate at different frequencies, in accordance with an embodiment.

Referring now to FIG. 7B, a sensor 760 is shown, in accordance with an additional embodiment. In an embodiment, the sensor 760 may comprise a plurality of resonators 725A-725D. Though, more or fewer resonators may be included in the sensor 760. The resonators 725A-725D may each be paired with a transmission line 727A-727D.

The resonators 725 may be spaced away from the transmission lines 727 by a gap G. In an embodiment, the gaps G1-G4 are different from each other. Also, the lengths of the resonators 725A-725D may be different from each other. The difference in the gaps G and the lengths of the resonators 725 may be used in order to provide frequency offsets for the sensor 760. The frequency offsets may be approximately 250 MHz or less. Though, larger frequency offsets may also be used in some embodiments.

Figure 7C:
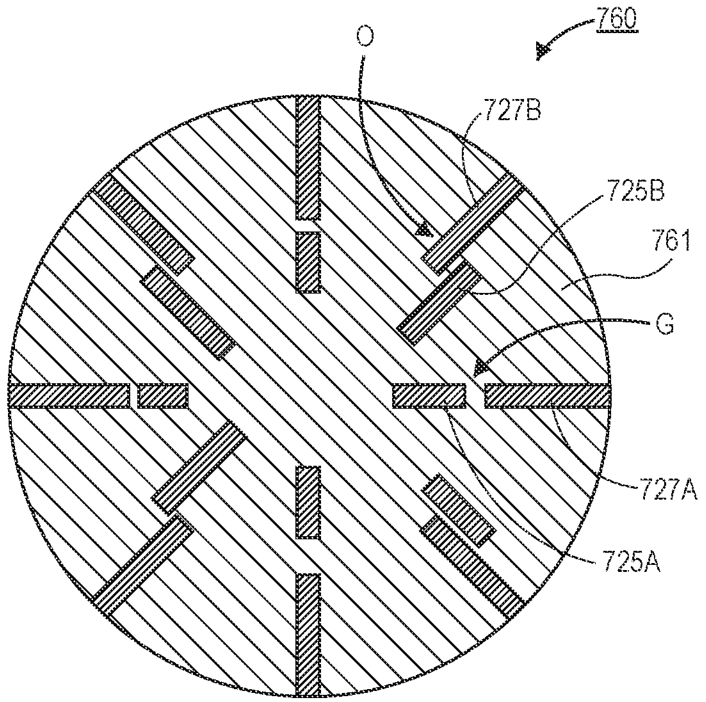
FIG. 7C is a plan view illustration of a wafer level sensor with first types of resonators and second types of resonators, in accordance with an embodiment.

Referring now to FIG. 7C, a plan view illustration of a sensor 760 is shown, in accordance with an additional embodiment. The sensor 760 in FIG. 7C may be similar to the sensor 760 in FIG. 7B, with the addition of second types of resonators. For example, first types of resonators 725A may be spaced apart from the transmission lines 727A by a gap G, and second types of resonators 725B may have an overlap O with the transmission lines 727B. The use of both types of resonator architectures may allow for an increased range of frequency detection.

Figure 7D:
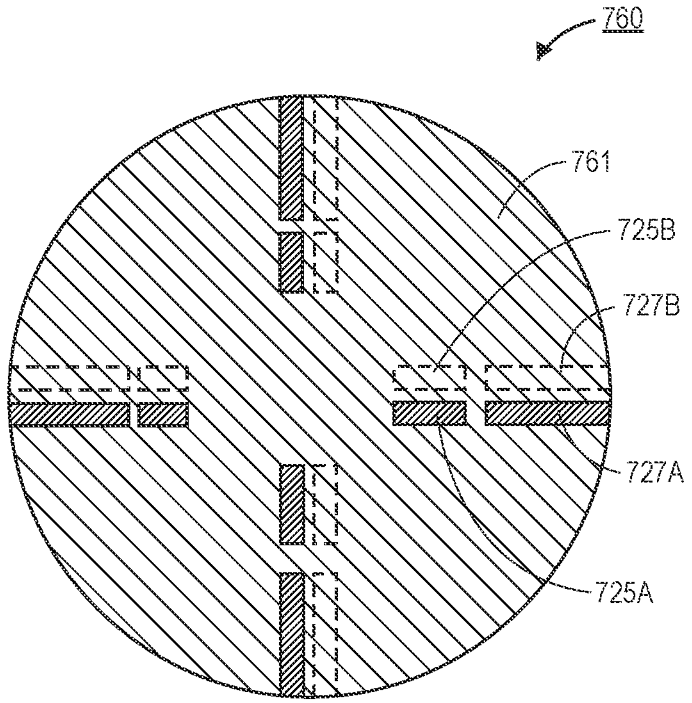
FIG. 7D is a plan view illustration of a wafer level sensor with first resonators over a surface of the substrate and second resonators buried within the substrate, in accordance with an embodiment.

Referring now to FIG. 7D, a plan view illustration of a sensor 760 is shown, in accordance with an additional embodiment. In an embodiment, the sensor 760 in FIG. 7D may be substantially similar to the sensor 760 in FIG. 7B, with the addition of reference resonators. For example, each resonator 725A on a surface of the substrate 761 is paired with a resonator 725B embedded in the substrate 761. The embedded resonator 725B and transmission line 727B may also be below a shield plane (not shown). Aside from vertical location, the pairs of resonators 725A and 725B may be substantially similar to each other. Accordingly, temperature compensation can be provided to the sensor 760.

Figure 8A:
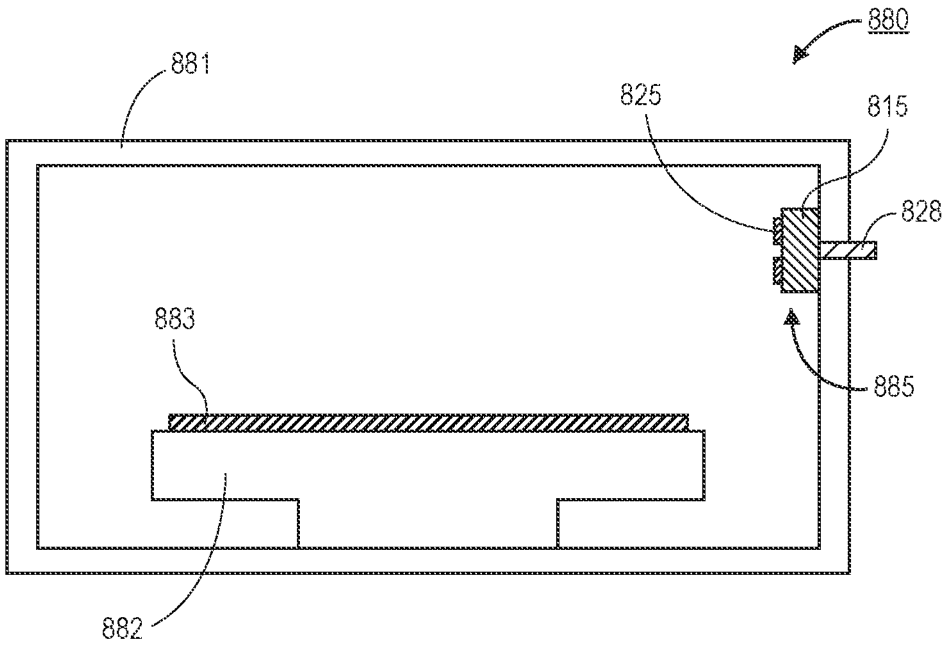
FIG. 8A is a cross-sectional illustration of a semiconductor processing tool with a wall mounted sensor, in accordance with an embodiment.

Referring now to FIG. 8A, a cross-sectional illustration of a semiconductor processing tool 880 is shown, in accordance with an embodiment. In an embodiment, the tool 880 comprises a chamber 881. The chamber 881 may be suitable for generating and supporting a plasma environment. For example, the chamber 881 may be a vacuum chamber, or the like. A support 882 may be provided in the chamber 881. The support 882 may include chucking features, thermal control features, and the like. The support 882 holds a substrate 883 that is to be processed in the chamber 881.

In an embodiment, a wall mounted sensor 885 is provided along a wall of the chamber 881. The sensor 885 may include a substrate 815, such as a PCB. One or more resonators 825 may be provided on the substrate 815. The resonators 825 may be similar to any of the resonator architectures described in greater detail herein. In an embodiment, a connector 828 may connect the sensor 885 to a cable (not shown) external to the chamber 881.

Figure 8B:
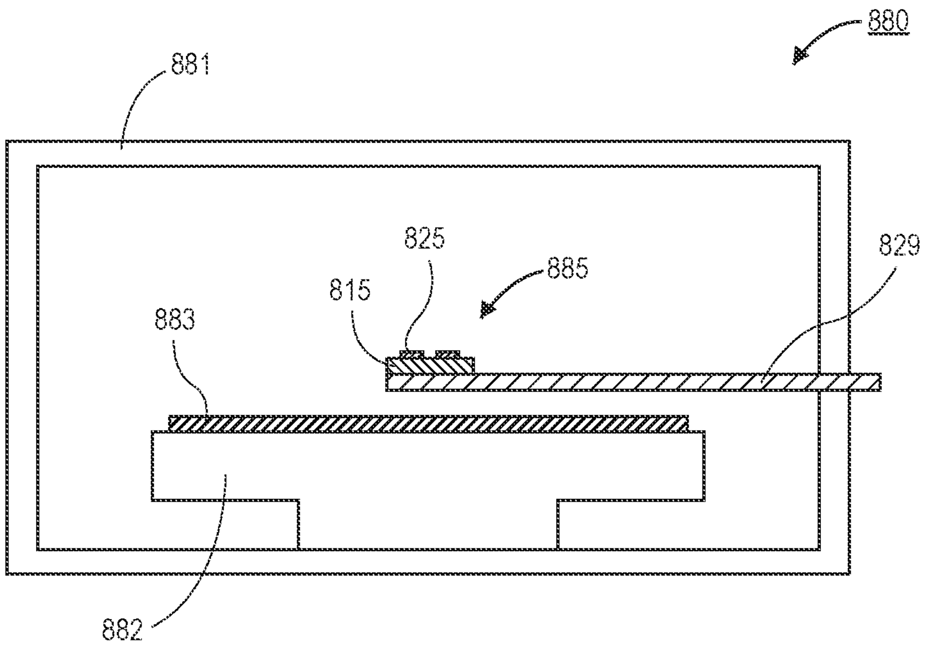
FIG. 8B is a cross-sectional illustration of a semiconductor processing tool with a probe sensor, in accordance with an embodiment.

Referring now to FIG. 8B, a cross-sectional illustration of a semiconductor processing tool 880 is shown, in accordance with an additional embodiment. The tool 880 in FIG. 8B may be similar to the tool 880 in FIG. 8A, with the exception of the sensor 885. Instead of being a wall mounted sensor 885, the sensor 885 is supported over the substrate 883 towards a center of the chamber 881. For example, a probe 829 extends from a wall of the chamber 881 towards a center of the chamber 881.

In an embodiment, the sensor 885 may include a substrate 815 with one or more resonators 825. The resonators 825 may have any suitable resonator architecture, such as those described in greater detail herein.

Figure 9:
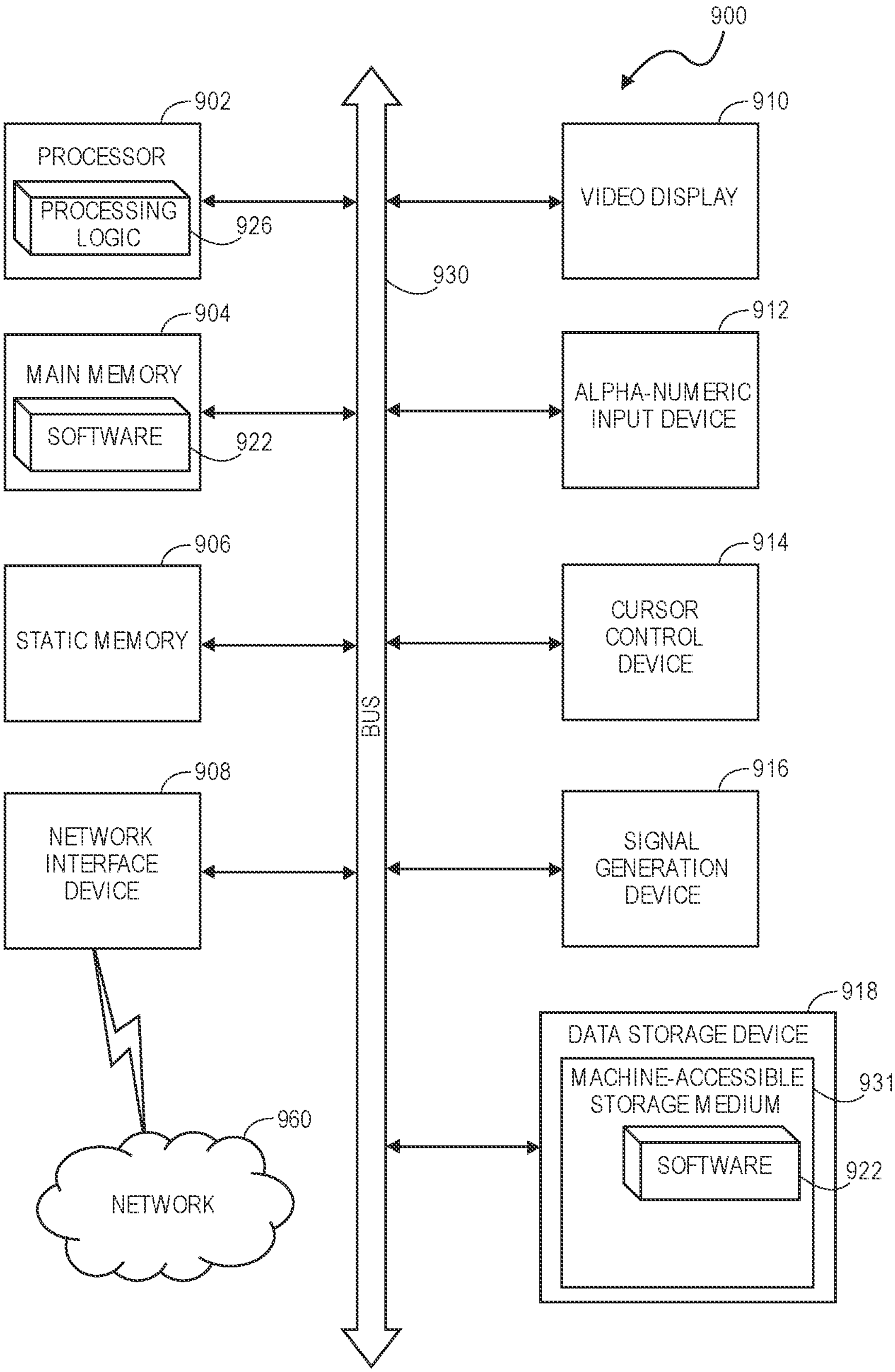
FIG. 9 illustrates a block diagram of an exemplary computer system that may be used in conjunction with a processing tool, in accordance with an embodiment.

Referring now to FIG. 9, a block diagram of an exemplary computer system 900 of a processing tool is illustrated in accordance with an embodiment. In an embodiment, computer system 900 is coupled to and controls processing in the processing tool. Computer system 900 may be connected (e.g., networked) to other machines in a Local Area Network (LAN), an intranet, an extranet, or the Internet. Computer system 900 may operate in the capacity of a server or a client machine in a client-server network environment, or as a peer machine in a peer-to-peer (or distributed) network environment. Computer system 900 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 900, the term "machine" shall also be taken to include any collection of machines (e.g., computers) that individually or jointly execute a set (or multiple sets) of instructions to perform any one or more of the methodologies described herein.

Computer system 900 may include a computer program product, or software 922, having a non-transitory machine-readable medium having stored thereon instructions, which may be used to program computer system 900 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 900 includes a system processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

System processor 902 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 902 may also be one or more special-purpose processing devices such as an application specific integrated circuit (ASIC), a field programmable gate array (FPGA), a digital signal system processor (DSP), network system processor, or the like. System processor 902 is configured to execute the processing logic 926 for performing the operations described herein.

The computer system 900 may further include a system network interface device 908 for communicating with other devices or machines. The computer system 900 may also include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium 932 (or more specifically a computer-readable storage medium) on which is stored one or more sets of instructions (e.g., software 922) embodying any one or more of the methodologies or functions described herein. The software 922 may also reside, completely or at least partially, within the main memory 904 and/or within the system processor 902 during execution thereof by the computer system 900, the main memory 904 and the system processor 902 also constituting machine-readable storage media. The software 922 may further be transmitted or received over a network 960 via the system network interface device 908. In an embodiment, the network interface device 908 may operate using RF coupling, optical coupling, acoustic coupling, or inductive coupling.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A module, comprising:

a substrate, wherein the substrate comprises a dielectric material;

a first microstrip resonator on the substrate;

a first microstrip transmission line on the substrate adjacent to the first microstrip resonator, wherein the first microstrip resonator is spaced from the first microstrip transmission line by a first gap;

a second microstrip resonator on the substrate, wherein a length of the second microstrip resonator is different than a length of the first microstrip resonator; and a second microstrip transmission line on the substrate, wherein the second microstrip resonator is spaced from the second microstrip transmission line by a second gap that is different than the first gap; and a ground plane on a surface of the substrate opposite from the first microstrip resonator and the second microstrip resonator.

2. The module of claim 1, wherein the first gap is between an end of the first microstrip transmission line and an end of the first microstrip resonator, and the second gap is between an end of the second microstrip transmission line and an end of the second microstrip resonator.

3. The module of claim 1, further comprising:

a stripline resonator;

a stripline transmission line, wherein the stripline resonator and the stripline transmission line are embedded in the substrate; and a conductive plane over the stripline resonator and the stripline transmission line.

4. The module of claim 3, wherein the stripline resonator and the stripline transmission line are configured to be a temperature compensator for the first microstrip resonator and the first microstrip transmission line.

5. The module of claim 1, further comprising:

a connector coupled to the first microstrip transmission line.

6. The module of claim 1, wherein the second microstrip resonator and the first microstrip resonator are tuned to different resonant frequencies in order to monitor a plasma at different stages of a plasma process.

7. A module for measuring plasma properties, comprising:

a substrate;

a first resonator on the substrate;

a first transmission line on the substrate coupled to the first resonator, wherein the first transmission line is spaced away from the first resonator by a first gap;

a second resonator on the substrate; and a second transmission line on the substrate, wherein the second resonator is spaced from the second transmission line by a second gap that is different than the first gap, and wherein a length of the second resonator is different than a length of the first resonator.

8. The module of claim 7, further comprising:

a connector coupled to the first transmission line, wherein the connector is configured to pass through a wall of a chamber.

9. The module of claim 7, further comprising:

a shaft connected to the substrate, wherein the shaft is configured to support the substrate towards a middle of a chamber.

10. The module of claim 7, further comprising:

a third resonator embedded in the substrate adjacent to the first resonator, wherein the first resonator and the third resonator have dimensions that allow for at least a 250 MHz operational frequency offset.

11. The module of claim 7, wherein the first resonator is a microstrip.

12. The module of claim 7, wherein the substrate is a dielectric substrate.

13. The module of claim 7, wherein the second resonator and the resonator are tuned to different resonant frequencies in order to monitor a plasma at different stages of a plasma process.

14. A semiconductor processing tool, comprising:

a chamber configured to generate a plasma;

a sensor within the chamber, wherein the sensor comprises:

a dielectric substrate;

a microstrip resonator;

a microstrip transmission line; and a ground plane on a surface of the dielectric substrate opposite from the microstrip resonator.

15. The semiconductor processing tool of claim 14, wherein the sensor is attached to a wall of the chamber.

16. The semiconductor processing tool of claim 14, wherein the sensor is a probe supported above a wafer support.

17. The semiconductor processing tool of claim 14, wherein the substrate is a 300 mm substrate.

18. The semiconductor processing tool of claim 14, wherein the microstrip resonator is embedded in the dielectric substrate.

19. A module, comprising:

a substrate, wherein the substrate comprises a dielectric material;

a microstrip resonator on the substrate;

a microstrip transmission line on the substrate adjacent to the microstrip resonator, wherein the microstrip resonator is spaced from the microstrip transmission line by a gap;

a ground plane on a surface of the substrate opposite from the microstrip resonator;

a stripline resonator;

a stripline transmission line, wherein the stripline resonator and the stripline transmission line are embedded in the substrate; and a conductive plane over the stripline resonator and the stripline transmission line.

20. A module for measuring plasma properties, comprising:

a substrate;

a resonator on the substrate;

a transmission line on the substrate coupled to the resonator, wherein the transmission line is spaced away from the resonator by a gap; and a connector coupled to the transmission line, wherein the connector is configured to pass through a wall of a chamber.

21. A module for measuring plasma properties, comprising:

a substrate;

a resonator on the substrate;

a transmission line on the substrate coupled to the resonator, wherein the transmission line is spaced away from the resonator by a gap; and a shaft connected to the substrate, wherein the shaft is configured to support the substrate towards a middle of a chamber.

22. A module for measuring plasma properties, comprising:

a substrate;

a resonator on the substrate;

a transmission line on the substrate coupled to the resonator, wherein the transmission line is spaced away from the resonator by a gap; and a second resonator embedded in the substrate adjacent to the resonator, wherein the resonator and the second resonator have dimensions that allow for at least a 250 MHz operational frequency offset.

* * * * *